US009457378B2

(12) United States Patent
Morselli et al.

(10) Patent No.: US 9,457,378 B2
(45) Date of Patent: Oct. 4, 2016

(54) METHOD OF APPLYING ADHESIVE TO OPENING DEVICES FOR GLUING TO SEALED PACKAGES OF POURABLE FOOD PRODUCTS

(71) Applicant: TETRA LAVAL HOLDINGS & FINANCE S.A., Pully (CH)

(72) Inventors: Alessandro Morselli, Piumazzo (IT); Roberto Franceschi, Casalecchio di Reno (IT); Alessandro Zuccotti, Corlo (Formigine) (IT)

(73) Assignee: TETRA LAVAL HOLDINGS & FINANCE S.A, Pully (CH)

( * ) Notice: Subject to any disclaimer, the term of this patent is extended or adjusted under 35 U.S.C. 154(b) by 299 days.

(21) Appl. No.: 13/923,542

(22) Filed: Jun. 21, 2013

(65) Prior Publication Data

US 2013/0287939 A1 Oct. 31, 2013

Related U.S. Application Data

(62) Division of application No. 12/085,709, filed as application No. PCT/EP2006/069876 on Dec. 19, 2006, now Pat. No. 8,485,122.

(30) Foreign Application Priority Data

Dec. 19, 2005 (EP) .................................... 05425894

(51) Int. Cl.
*B05D 5/10* (2006.01)
*B65B 3/00* (2006.01)
(Continued)

(52) U.S. Cl.
CPC . *B05D 5/10* (2013.01); *B05B 3/18* (2013.01); *B65B 3/00* (2013.01); *B65B 7/2871* (2013.01); *B65B 61/14* (2013.01); *B65B 61/186* (2013.01); *Y10T 156/109* (2015.01); *Y10T 156/1798* (2015.01)

(58) Field of Classification Search
CPC ........ B05D 5/10; B65B 61/14; B65B 7/2871
See application file for complete search history.

(56) References Cited

U.S. PATENT DOCUMENTS

| | | | |
|---|---|---|---|
| 4,760,750 | A | 8/1988 | Kondoh |
| 5,100,284 | A | 3/1992 | Boisseau |

(Continued)

FOREIGN PATENT DOCUMENTS

| | | | |
|---|---|---|---|
| JP | 61-203066 A | 9/1986 | |
| JP | 06-505447 A | 6/1994 | |

(Continued)

OTHER PUBLICATIONS

International Search Report.

(Continued)

*Primary Examiner* — Xiao Zhao
(74) *Attorney, Agent, or Firm* — Buchanan Ingersoll & Rooney PC

(57) ABSTRACT

A gluing unit for applying adhesive to a succession of opening devices to be fitted to respective sealed packages of pourable food products includes a conveyor for feeding the opening devices long a path, and an adhesive dispenser located along the path and interacting with each opening device on the conveyor to apply the adhesive to a portion of the opening device. The dispenser is movable parallel to the path to increase output of the unit.

8 Claims, 5 Drawing Sheets

(51) Int. Cl.

| | |
|---|---|
| ***B65B 7/28*** | (2006.01) |
| ***B65B 61/14*** | (2006.01) |
| ***B65B 61/18*** | (2006.01) |
| ***B05B 3/18*** | (2006.01) |

(56) References Cited

U.S. PATENT DOCUMENTS

| | | | | |
|---|---|---|---|---|
| 5,219,320 | A | 6/1993 | Abrams et al. | |
| 5,479,352 | A | 12/1995 | Smith | |
| 5,938,871 | A | 8/1999 | Nakahira et al. | |
| 6,092,351 | A | 7/2000 | Imkamp et al. | |
| 6,205,746 | B1 | 3/2001 | Moss et al. | |
| 2004/0224086 | A1* | 11/2004 | Wright | B05B 7/24 427/207.1 |
| 2006/0280501 | A1* | 12/2006 | Chan | G03F 7/3042 396/627 |

FOREIGN PATENT DOCUMENTS

| | | | |
|---|---|---|---|
| JP | 2004-106916 | A | 4/2004 |
| JP | 2005-514231 | A | 5/2005 |
| WO | 03/057460 | A1 | 7/2003 |

OTHER PUBLICATIONS

Written Opinion of the International Search Authority.

Office Action (Reasons) issued on Feb. 1, 2012, by the Japanese Patent Office in corresponding Japanese Patent Application No. 2008-545018 and an English translation of the Office Action. (11 pages).

* cited by examiner

METHOD OF APPLYING ADHESIVE TO OPENING DEVICES FOR GLUING TO SEALED PACKAGES OF POURABLE FOOD PRODUCTS

CROSS REFERENCES TO RELATED APPLICATIONS

This application is a divisional of U.S. application Ser. No. 12/085,709 filed on May 29, 2008 which is a U.S. national stage application based on International Application No. PCT/EP2006/069876 filed on Dec. 19, 2006 and which claims priority to European Application No. 05425894.2 filed on Dec. 19, 2005, the entire content of all three of which is incorporated herein by reference.

TECHNICAL FIELD

The present invention relates to a gluing unit and to a method of applying adhesive to opening devices for gluing to sealed packages of pourable food products.

BACKGROUND DISCUSSION

As is known, many pourable food products, such as fruit juice, UHT (ultra-high-temperature treated) milk, wine, tomato sauce, etc., are sold in packages made of sterilized packaging material.

A typical example of this type of package is the parallelepiped-shaped package for liquid or pourable food products known as Tetra Brik Aseptic (registered trademark), which is made by folding and sealing laminated strip packaging material. The packaging material has a multilayer structure comprising a base layer for stiffness and strength, which may comprise a layer of fibrous material, e.g. paper, or of mineral-filled polypropylene material, and which is covered on both sides with layers of thermoplastic material, e.g. polyethylene film. In the case of aseptic packages for long-storage products, such as UHT milk, the packaging material comprises a layer of oxygen-barrier material, e.g. aluminium foil, which is superimposed on a layer of thermoplastic material, and is in turn covered with another layer of thermoplastic material forming the inner face of the package eventually contacting the food product.

As is known, packages of this sort are produced on fully automatic packaging machines, on which a continuous tube is formed from the web-fed packaging material; the web of packaging material is sterilized on the packaging machine, e.g. by applying a chemical sterilizing agent, such as a hydrogen peroxide solution, which, once sterilization is completed, is removed from the surfaces of the packaging material, e.g. evaporated by heating; and the web of packaging material so sterilized is maintained in a closed, sterile environment, and is folded and sealed longitudinally to form a vertical tube.

The tube is filled with the sterilized or sterile-processed food product, and is sealed and subsequently cut along equally spaced cross sections to form pillow packs, which are then folded mechanically to form respective finished, e.g. substantially parallelepiped-shaped, packages.

Alternatively, the packaging material may be cut into blanks, which are formed into packages on forming spindles, and the packages are filled with the food product and sealed. One example of this type of package is the so-called "gable-top" package known by the trade name Tetra Rex (registered trademark).

Once formed, the above packages may undergo further processing, such as the application of a reclosable opening devices to protect the food product inside the package from contact with external agents, and to enable the product to be poured out.

At present, the most commonly marketed opening devices comprise an annular frame portion defining a pour opening and fitted about a removable or pierceable portion of a top wall of the package; and a cap hinged or screwed to the frame portion, and which is removable to open the package. Alternatively, other types of opening, e.g. slide-open, devices are also known to be used.

The removable portion of the package may be defined by a sealing sheet glued or heat-sealed to the outside of the package to close a through hole in the package. One example of this solution is described and illustrated in Patent Application EP-A-9433549. Alternatively, the removable portion of the package may be defined by a so-called "prelaminated" hole, i.e. a hole formed in the base layer of the packaging material before covering the base layer with other layers defining the packaging material, e.g. the layers of thermoplastic material and/or the layer of barrier material, which close the hole hermetically. One example of this solution is described and illustrated in Patent Application EP-A-331798.

In both cases, before being applied to the respective packages, the opening devices are fed successively through a gluing unit, in which they are coated with adhesive, usually hot-melt glue.

Gluing units are known which substantially comprise a conveyor for feeding the opening devices along a given path; and an adhesive dispenser, which interacts with each opening device to apply adhesive to one or more specific areas of a fastening portion of the opening device.

More specifically, the adhesive is applied by stopping the conveyor and operating the dispenser along a given deposition path, so as to apply adhesive to a first substantially oval-shaped area, and a second spot area, lying within the first area, of the opening device.

In particular, to ensure the adhesive glues the opening device firmly to, and seals, the area of the package to which the opening device is applied, at least part of the deposition path must be covered more than once.

Though reliable and efficient, the gluing units described still leave room for further improvement, particularly as regards stepping up output.

In particular, the output of known units is limited by the speed at which the dispenser travels along the deposition path having to allow the adhesive to interact with each opening device long enough to reduce the formation of adhesive trickle, between the dispenser and the opening device, which would impair efficiency of the opening device and call for frequent cleaning of the dispenser, thus reducing output.

The method disclosed here is able to apply adhesive to opening devices for gluing to sealed packages of pourable food products that is not so susceptible to drawbacks typically associated with known gluing methods.

The disclosed method involves feeding the opening devices along a path, applying the adhesive to each opening device by dispensing means; and wherein, in the course of the feeding, the dispensing means are moved parallel to the path.

BRIEF DESCRIPTION OF THE DRAWINGS

A preferred, non-limiting embodiment of the present invention will be described by way of example with reference to the accompanying drawings, in which.

DETAILED DESCRIPTION

With reference to FIGS. 1 to 4, number 1 indicates as a whole a gluing unit, in accordance with the present invention, which can be incorporated in a known pourable food product packaging machine (not shown) of the type described in the introduction, to apply adhesive in the example shown, hot melt glue to a succession of reclosable plastic opening devices for gluing, to packages (not shown) filled, sealed, and formed on the machine.

Non-limiting examples of the packages produced on packaging machines of the type referred to above are the parallelepiped-shaped packages known by the trade name Tetra Brik Aseptic (registered trademark) or so-called "gable-top" packages known by the trade name Tetra Rex (registered trademark).

The packaging material of the packages has a multilayer structure (not shown) comprising a base layer of fibrous material, e.g. paper, or mineral-filled polypropylene, covered on both sides with layers of thermoplastic material, e.g. polyethylene film. In the case of aseptic packages for long-storage products, such as UHT milk, the packaging material comprises a layer of oxygen-barrier material, e.g. aluminium foil, which is superimposed on a layer of thermoplastic material, and is in turn covered with another layer of thermoplastic material forming the inner face of the package eventually contacting the food product.

Unit 1 is particularly suitable for accurately and evenly distributing said adhesive on opening devices that can be glued to the respective packages.

Figure 5:
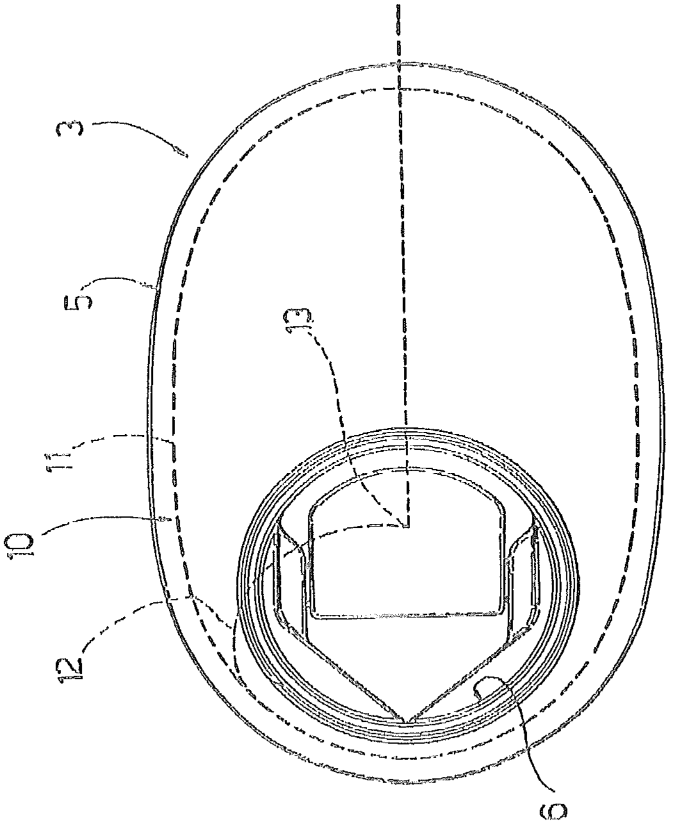
FIG. 5 shows the opening device, viewed from the side for gluing to the respective package.

One example of such opening devices is shown in FIG. 5, is indicated as a whole by 3, and is referred to in the following description purely by way of a non-limiting example.

Opening device 3 is applied to a removable portion of a respective package (not shown), i.e. a portion that can be detached from the rest of the package to enable the pourable product to be poured out.

The removable portion may be defined by a sealing sheet glued or heat-sealed to the package to close a through hole in the package. Alternatively, the removable portion may be defined by a so-called "prelaminated" hole, i.e. a hole formed in the base layer of the packaging material and closed hermetically by other layers defining the packaging material (at least the layers of thermoplastic material).

As shown in FIG. 5, opening device 3 substantially comprises an oval frame portion 5, which is glued to a wall of a respective package so that a circular pour opening 6 is located at the removable portion; and a cap 7 (only shown in FIG. 3), which is screwed to frame portion 5 to close opening 6, and is removable from frame portion 5 to pour out the food product.

More specifically, frame portion 5 defines an adhesive application area 10 by which to fix opening device 3 to the respective package.

More specifically, area 10 comprises a substantially oval portion 11 surrounding opening 6; and a point 13 located within portion 11. In particular, point 13 is located at one end of an arc-shaped portion 12 extending from and inwards of portion 11.

With reference to FIGS. 1 to 4' unit 1 substantially comprises a conveyor 20 for feeding devices 3 successively along a straight path A from a known feed station (not shown) to a known output station (not shown); and an adhesive dispenser assembly 21, which interacts sequentially with each opening device 3 to apply adhesive on area 10 of frame portion 5.

More specifically, conveyor 20 extends along one side of and below a fixed horizontal table 17 of unit 1, and dispenser assembly 21 extends from table 17 towards conveyor 20.

Advantageously, dispenser assembly 21 is movable parallel to path A to apply the adhesive faster to each opening device 3.

More specifically, dispenser assembly 21 is movable parallel to path A at the same speed as the travelling speed of opening devices 3 along path A, so as to move integrally with opening devices 3.

Dispenser assembly 21 is also movable, with respect to opening devices 3 and with a curved component of motion, along a deposition path along which adhesive is deposited on each opening device 3. More specifically, the deposition path is shaped in accordance with the shape of area 10.

More specifically, dispenser assembly 21 moves in a horizontal plane parallel to the plane containing opening devices 3.

More specifically, dispenser assembly 21 is moved with respect to table 17 in a direction X, perpendicular to path A, by a first drive 22, and in a direction Y, parallel to path A, by a second drive 23.

Dispenser assembly 21 comprises a supporting body 24; a number of dispensers 25 fitted to supporting body 24; and a horizontal plate 26 from which supporting body 24 projects. Plate 26 is movable, with respect to table 17, in directions X and Y by first and second drives 22 and 23 respectively, so as to move dispensers 25 in directions X, Y.

More specifically, in the example shown, dispensers 25 are three in number, and project from supporting body 24 towards conveyor 20. Dispensers 25 are aligned parallel to path A, and each comprise a respective nozzle 27 facing conveyor 20 to feed adhesive onto a respective opening device 3.

Plate 26 extends parallel to the plane defined by directions X and Y, and is fixed at an end edge to supporting body 24, so that supporting body 24 and dispensers 25 are interposed between conveyor 20 and plate 26.

Dispenser assembly 21 also comprises a feed conduit 28 for feeding adhesive to dispensers 25 in a manner not shown.

Figure 4:
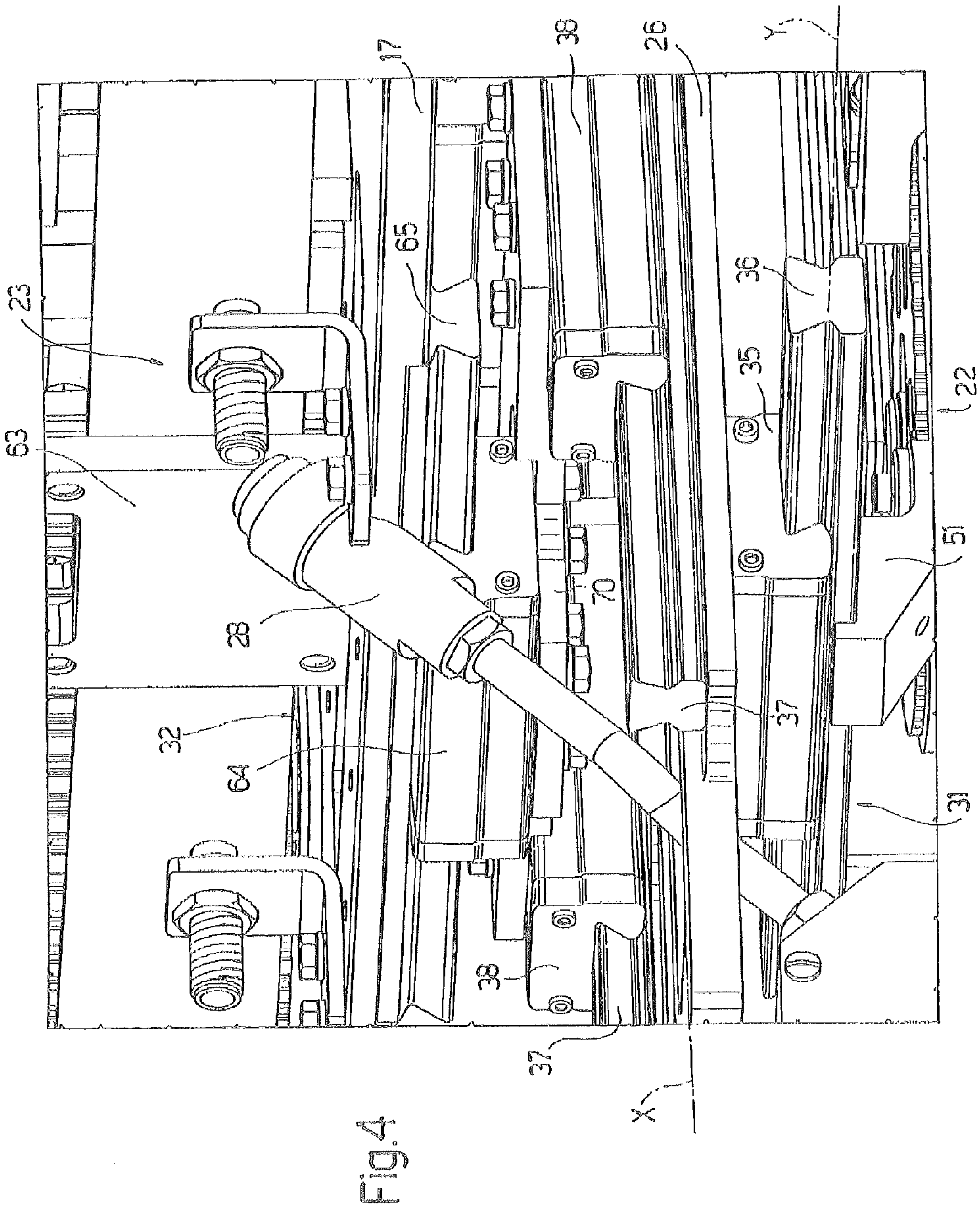
FIG. 4 shows a much larger-scale view in perspective of details of the FIG. 1 gluing unit.

With particular reference to FIG. 4, first drive 22 and second drive 23 are located underneath and on top of table 17 respectively, and are connected to plate 26 to move plate 26 independently in directions X and Y.

More specifically, an underside surface of plate 26 is connected to first drive 22 by a first connecting assembly 31; and a topside surface of plate 26 is connected to second drive 23 by a second connecting assembly 32.

First connecting assembly 31 allows plate 26 to move in direction X when first drive 22 is operated, and to move, with respect to first drive 22, in direction Y when second drive 23 is operated.

More specifically, first connecting assembly 31 comprises two members 35, 36 connected to each other and each extending parallel to direction Y.

Member 35 is fixed to the underside surface of plate 26, and member 36 is movable parallel to direction X by first drive 22.

Member 35 defines a cavity engaged by member 36, which has an outer profile complementary in shape to the cavity of member 35.

Members 35, 36 are so connected that movement of member 36 parallel to direction X moves member 35, plate 26, and dispenser assembly 21 parallel to direction X, whereas member 36 is free to slide, inside member 35, parallel to direction Y.

Plate 26 is also connected to second drive 23 by second connecting assembly 32, which moves plate 26 parallel to direction Y with respect to table 17 when second drive 23 is operated, and allows plate 26 to slide with respect to second drive 23 when first drive 22 is operated.

Second connecting assembly 32 comprises two pairs of members 37, 38, which extend parallel to direction X, a given distance apart.

More specifically, each member 37 is fixed to the topside surface of plate 26, and each member 38 is moved parallel to direction Y by second drive 23.

Each member 37 is connected to respective member 38 by a shape fit. More specifically, each member 38 defines a respective cavity engaged in sliding manner, in direction X, by member 37.

Each member 37 and respective member 38 are so connected that movement of member 38 in direction Y moves member 37, plate 26, and dispenser assembly 21 parallel to direction Y, whereas members 38 are free to slide parallel to direction X with respect to members 37.

Figure 1:
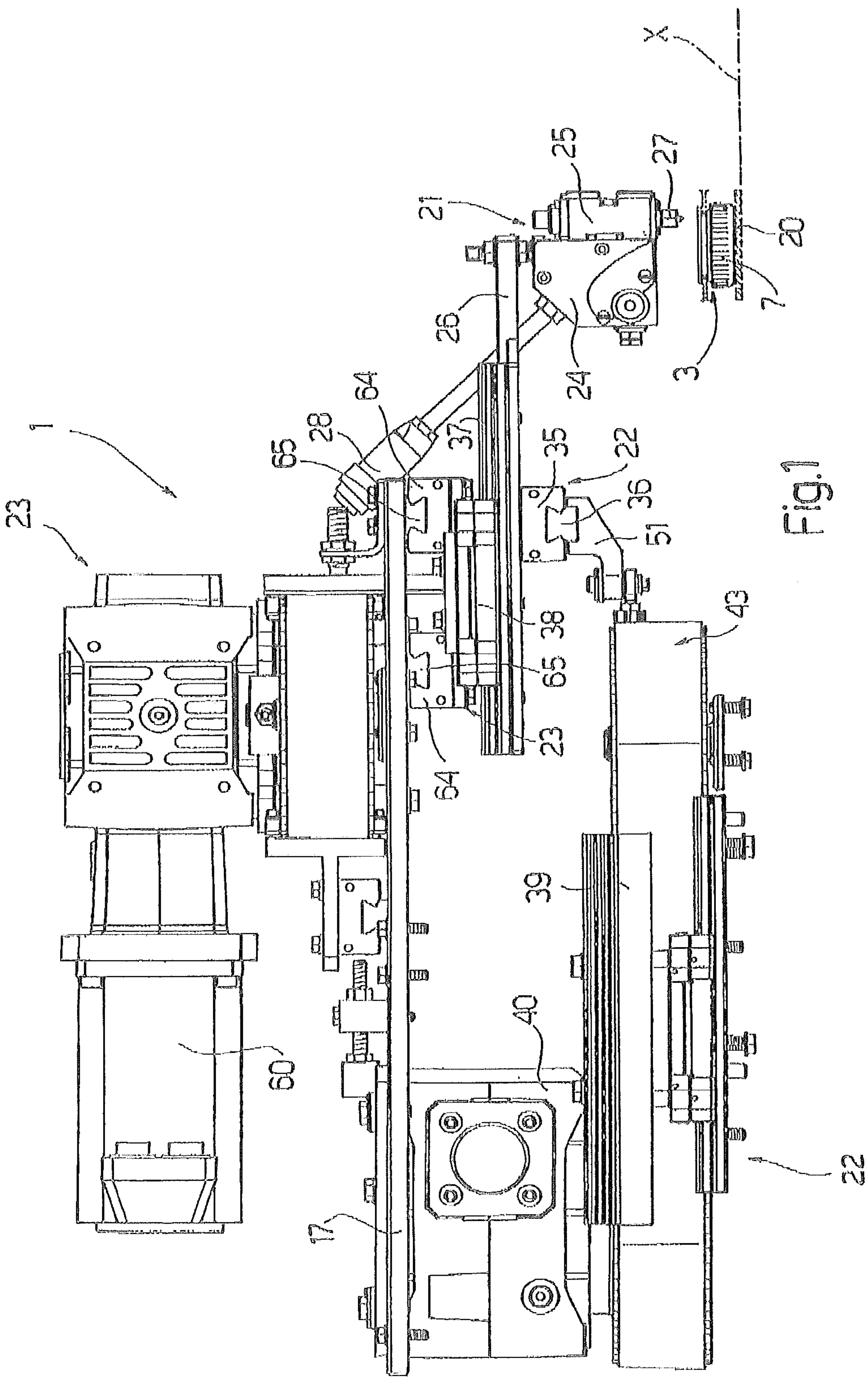
FIG. 1 shows a front view of a gluing unit, in accordance with the present invention, for applying adhesive to opening devices for gluing to sealed packages of pourable food products.
Figure 2:
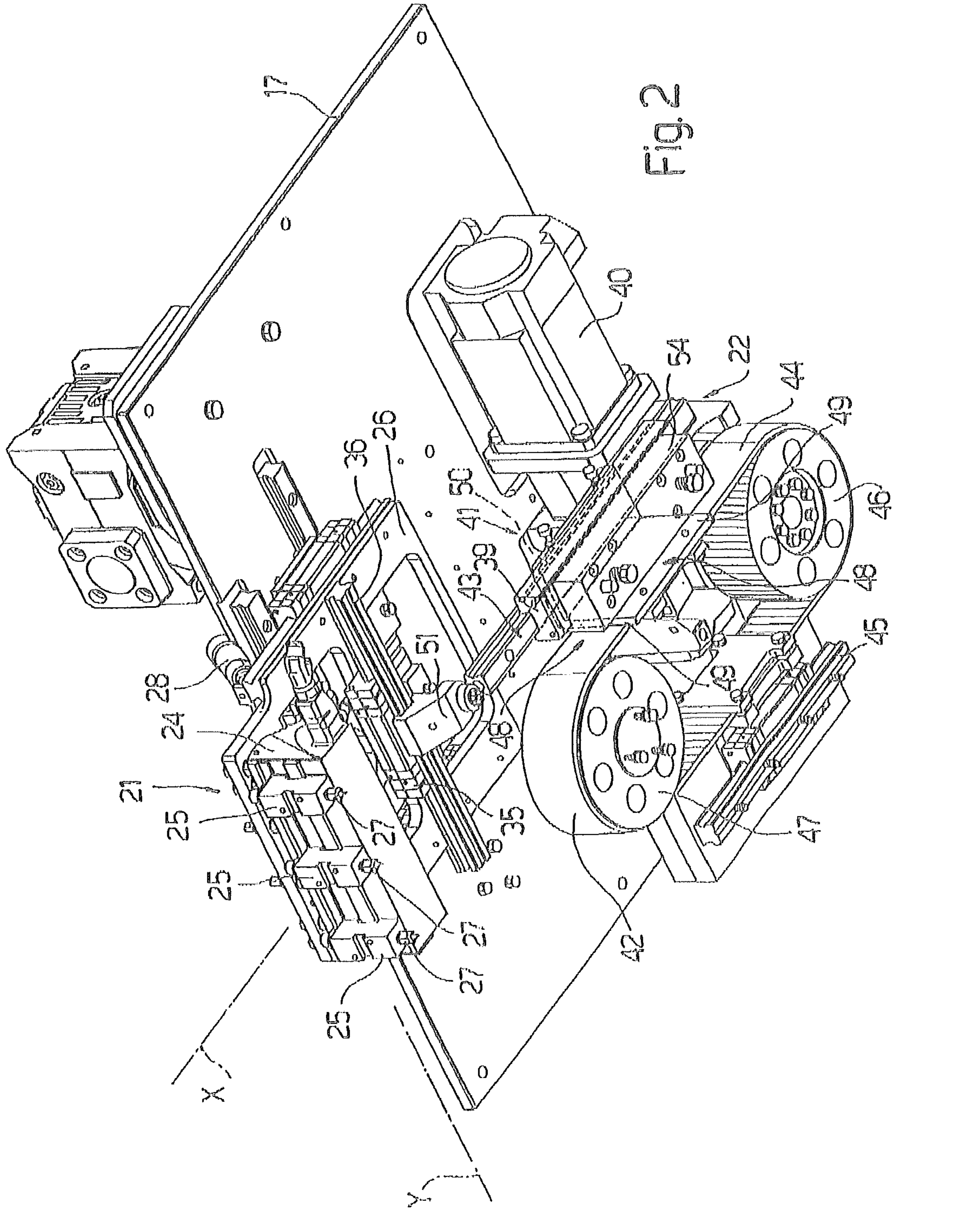
FIGS. 2 and 3 show views in perspective, with parts removed for clarity, of the FIG. 1 gluing unit.

With particular reference to FIG. 2, first drive 22 comprises a motor 40; and a transmission 41 for converting the power of motor 40 to translation of member 36 parallel to direction X, and so translating dispenser assembly 21 parallel to direction X.

More specifically, transmission 41 comprises an endless belt 42 powered by motor 40; and a slide 43 moved parallel to direction X by belt 42 and connected to member 36 to move member 36 in direction X.

More specifically, belt 42 is looped about a drive pulley 46, connected operatively to motor 40, and a return pulley 47, which are mounted for rotation about respective axes parallel to each other and perpendicular to the plane defined by directions X, Y.

More specifically, slide 43 extends parallel to direction X, and runs inside a fixed rail 54 extending parallel to direction X and complementary in shape to slide 43.

An intermediate portion of slide 43 is connected to a branch 44 of belt 42 extending parallel to direction X, so that the slide is movable in direction X; and one end of slide 43, facing dispenser assembly 21, is connected operatively to member 36 to move member 36, and therefore dispenser assembly 21, in direction X.

More specifically, slide 43 and belt 42 are connected to each other by an L-shaped member 48, which comprises a first wall 49 fixed to the outside of branch 44 of belt 42, and a second wall 50 fixed to the bottom of slide 43.

A portion 51 of slide 43, fitted to the outside of member 36, on the opposite side to member 35, connects slide 43 operatively to member 36.

First drive 22 also comprises a counterweight 45, located on the opposite side of belt 42 to motor 40, to balance the moving masses and reduce in-service vibration of drive 22.

Figure 3:
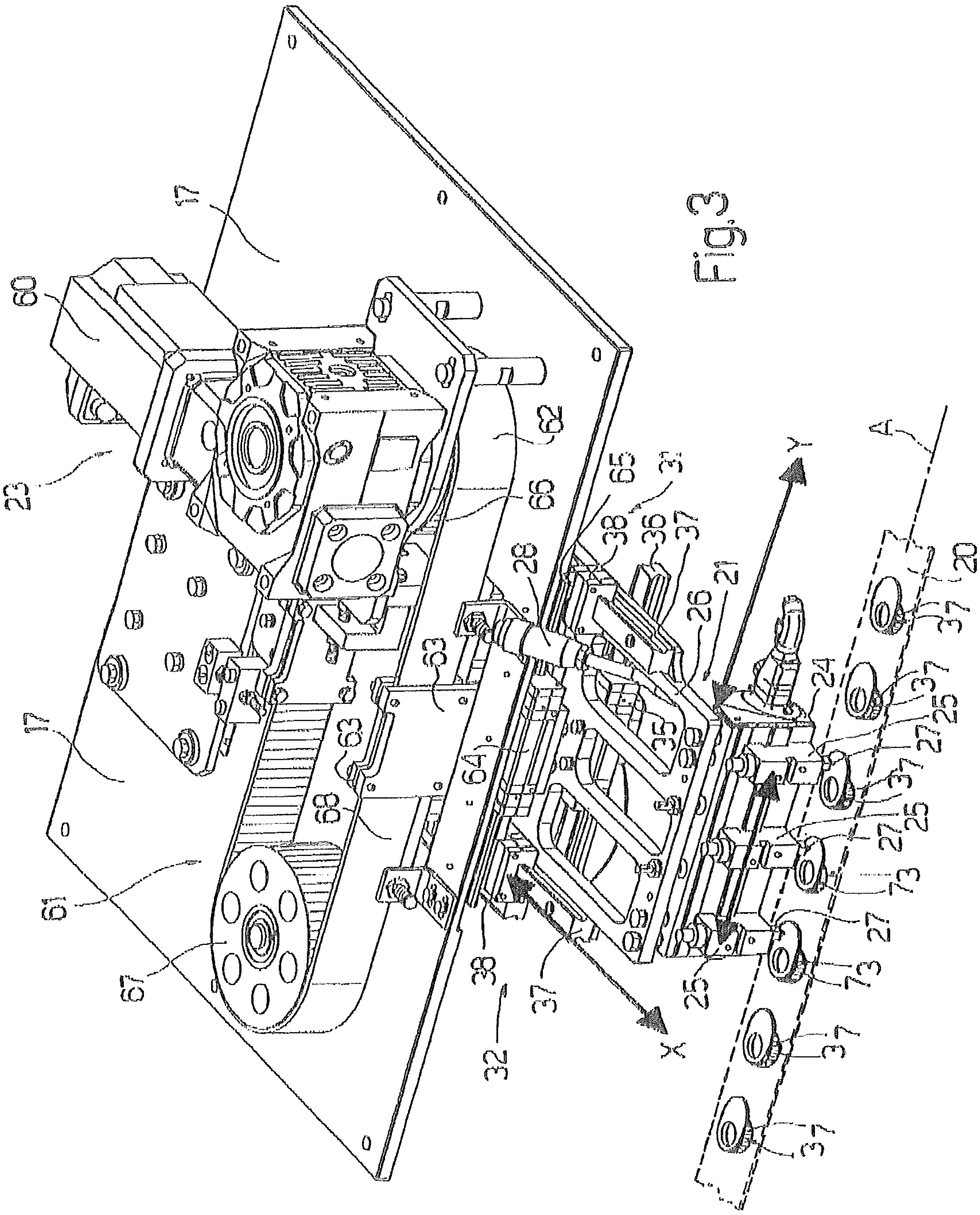

With particular reference to FIGS. 3 and 4, second drive 23 comprises a motor 60; and a transmission 61 for converting the power of motor 60 to translation of member 38 in direction Y, and therefore of dispenser assembly 21 in direction Y.

More specifically, transmission 61 comprises an endless belt 62 powered by motor 60; and two slides 64 moved parallel to direction Y by belt 62 and connected to respective members 38 to move respective members 38 in direction Y. By virtue of the connection between members 38, members 37, and plate 26, dispenser assembly 21 therefore moves in direction Y.

Belt 62 is looped about a drive pulley 66, connected operatively to motor 60, and a return pulley 67, which are mounted for rotation about respective axes parallel to each other and perpendicular to the plane defined by directions X, Y.

Each slide 64 runs parallel to direction Y along a respective rail 65 fixed to table 17.

Slides 64 extend parallel to direction Y, and each define a respective cavity; and each rail 65 extends parallel to direction Y, and has a respective outer profile complementary in shape to the cavity of respective slide 64.

The above connection allows each slide 64 to slide parallel to direction Y with respect to relative rail 65, and locks each rail 65 to relative slide 64 in direction X.

Each slide 64 is connected by a respective vertical plate 63 to a branch 68, parallel to direction Y, of belt 62, so as to be movable in direction Y. More specifically, plates 63 are bolted to each other; one of plates 63 connects an inner portion of branch 68 to one of slides 64; and the other plate 63 connects an outer portion of branch 68 to the other slide 64.

On the opposite side to rails 65, slides 64 are connected to members 38 by a plate 70. More specifically, a topside surface of plate 70 is bolted to slides 64, and an underside surface of plate 70 is bolted to members 38.

Second drive 23 also comprises a counterweight (not shown, by being known and performing the same function as counterweight 45) to balance the masses and reduce in service vibration of drive 23.

In actual use, opening devices 3 are fed along path A, so that the side of each to be glued faces dispenser assembly 21.

When opening devices 3 are positioned beneath dispenser assembly 21, each dispenser 25 is moved, from a start position, parallel to path A at the same speed as a respective opening device 3.

As it moves parallel to path A, each dispenser 25 performs a work cycle comprising a step in which adhesive is dispensed onto respective opening device 3, and a step in which no adhesive is dispensed.

More specifically, during the step in which adhesive is dispensed, and as it moves parallel to path A, each dispenser 25 is moved, with respect to respective opening device 3, along the deposition path to deposit adhesive in area 10 of respective opening device 3. More specifically, area 10 may be covered more than once, to ensure effective gluing of each opening device 3 to the respective package.

During the step in which no adhesive is dispensed, each dispenser 25 continues moving parallel to path A for a predetermined time. More specifically, during the step in which no adhesive is dispensed, each dispenser 25 moves first along portion 12, and then, from point 13, away from opening 6 and parallel to a major axis of portion 11.

Said predetermined time is necessary to reduce the formation of adhesive trickle, between each dispenser 25 and respective opening device 3, which would impair the efficiency of opening device 3 and call for frequent cleaning of dispensers 25, thus reducing output.

At this point, dispensers 25 are returned to the start position to perform another work cycle. More specifically, during its work cycle, each dispenser 25 is moved independently by first drive 22 in direction X, and by second drive 23 in direction Y.

More specifically, first drive 22 moves dispensers 25 of dispenser assembly 21 parallel to direction X by virtue of transmission 41 converting the power of motor 40 to translation of member 36 in direction X.

More specifically, by virtue of the connection of motor 40, branch 44 of belt 42, member 48, and slide 43, portion 51 is translated parallel to direction X, thus also translating member 36, member 35, plate 26, and dispensers 25 parallel to direction X.

The vibration induced by operation of first drive 22 is balanced by counterweight 45.

Second drive 23 moves dispensers 25 of dispenser assembly 21 parallel to direction Y by virtue of transmission 61 converting the power of motor 60 to translation of members 38 in direction Y.

More specifically, by virtue of the connection of motor 60, branch 68 of belt 62, plates 63, and slides 64, plate 70 is translated parallel to direction Y, thus also translating members 38, members 37, plate 26, and dispensers 25 parallel to direction Y.

The vibration induced by operation of second drive 23 is balanced by the counterweight.

The advantages of unit 1 and the method according to the present invention will be clear from the foregoing description.

In particular, unit 1 permits extremely high output.

That is, by virtue of dispenser assembly 21 moving parallel to path A along which opening devices 3 are fed, opening devices 3 need not be arrested along path A, thus obviously increasing the output of unit 1.

What is more, increased output of unit 1 is achieved while at the same time allowing a predetermined length of time for the adhesive to interact with each opening device 3.

As a result, the formation of adhesive trickle between each dispenser 25 and relative opening device 3 is reduced, thus eliminating malfunctioning of opening device 3, frequent cleaning of dispensers 25 and, hence, reduced output.

Finally, the output of unit 1 may be increased by simply increasing the number of dispensers 25 on dispenser assembly 21.

Clearly, changes may be made to unit 1 and the method without, however, departing from the scope of the accompanying Claims.

In particular, dispenser assembly 21 may comprise only one dispenser 25.

What is claimed is:

1. A method of applying adhesive to opening devices configured to be fitted to respective sealed packages of pourable food products, the method comprising:
- moving the opening devices along a path, each opening device comprising a frame portion surrounding an opening;
- moving a dispenser parallel to the path while the opening devices are also moving along the path;
- during the moving of the dispenser parallel to the path, moving the dispenser relative to at least one of the opening devices that is moving along the path so that the dispenser moves along a deposition path;
- dispensing the adhesive from the dispenser while the dispenser is moving parallel to the path and while the dispenser is moving along the deposition path; and
- applying the adhesive dispensed from the dispenser to an adhesive application area on the frame portion of at least one of the opening devices while both the at least one opening device is moving along the path and the dispenser is moving parallel to the path.

2. The method as claimed in claim 1, wherein the moving of the dispenser relative to the at least one opening device along the deposition path includes operating first and second motors which each move the dispenser in respective directions crosswise to each other.

3. The method as claimed in claim 1, wherein the moving of the dispenser relative to at least one of the opening devices further comprises moving the dispenser relative to the at least one opening device in two directions crosswise to each other.

4. The method as claimed in claim 1, wherein the moving of the opening devices along the path comprises moving the opening devices in which a cap is removably fitted to the frame portion of each opening device to close the opening.

5. The method as claimed in claim 1, wherein the dispenser is moved parallel to the path and the opening devices are moved along the path at the same speed.

6. The method as claimed in claim 1, further comprising, after applying the adhesive dispensed from the dispenser to the adhesive application area, stopping dispensing of the adhesive from the dispenser while also moving the dispenser within the adhesive application area on the frame portion.

7. The method as claimed in claim 1, wherein the applying of the adhesive to the adhesive application area comprises applying the adhesive to a curved adhesive application area.

8. The method as claimed in claim 1, wherein the applying of the adhesive to the adhesive application area comprises applying the adhesive to an oval-shaped adhesive application area.

* * * * *